United States Patent

Xu

[11] Patent Number: 5,467,220
[45] Date of Patent: Nov. 14, 1995

[54] METHOD AND APPARATUS FOR IMPROVING SEMICONDUCTOR WAFER SURFACE TEMPERATURE UNIFORMITY

[75] Inventor: Zheng Xu, Foster City, Calif.

[73] Assignee: Applied Materials, Inc., Santa Clara, Calif.

[21] Appl. No.: 198,726

[22] Filed: Feb. 18, 1994

[51] Int. Cl.$^6$ .............................. G02B 5/10; F27D 11/00
[52] U.S. Cl. ..................... 359/350; 219/405; 219/411; 359/853
[58] Field of Search .................................. 359/350, 359, 359/853, 850, 867; 219/405, 411

[56] References Cited

U.S. PATENT DOCUMENTS

| | | | |
|---|---|---|---|
| 4,481,406 | 11/1984 | Muka | 219/411 |
| 4,975,561 | 12/1990 | Robinson et al. | 219/405 |
| 4,981,815 | 1/1991 | Kakoschke | 219/405 |
| 5,179,677 | 1/1993 | Anderson et al. | 392/411 |
| 5,253,324 | 10/1993 | Wortman et al. | 392/416 |
| 5,259,883 | 11/1993 | Yamabe et al. | 118/725 |

OTHER PUBLICATIONS

M. Taguchi, K. Koyama, Y. Sugano, Quarter Micron Hole Filling With SiN Side Walls By Aluminum High Temperature Sputtering, IEEE VMIC Conference, p. 219 (1992).
H. H. Hoang, F. S. Chen, M. Zamanian, G. A. Dixit, C. C. Wei, F. T. Lious, Reliability Study of Planarized Aluminum Metallization, IEEE VMIC Conference, p. 411 (1991).
C. S. Park, S. I. Lee, J. H. Park, J. H. Sohn, D. Chin, J. G. Lee, Al–PLAPH Process For Planarized Double Metal CMOS Application, IEEE VMIC Conference, p. 326 (1991).
H. Nishimura, T. Yamada, S. Ogawa, Reliable Submicron Vias Using Aluminum Alloy High Temperature Sputter Filling, IEEE VMIC Conference, p. 170 (1991).
H. Ono, Y. Ushiku, T. Yoda, Development of a Planarized Al–Si Contact Filling Technology, IEEE VMIC Conference, p. 76 (1991).

*Primary Examiner*—Martin Lerner
*Attorney, Agent, or Firm*—Michael A. Glenn; Robert J. Stern

[57] ABSTRACT

In a processing chamber that includes a wafer pedestal adapted to heat and cool a wafer during wafer processing, where the wafer is secured to the pedestal with a wafer clamp ring, a yoke having a surface in spaced facing relation with a wafer surface is positioned atop the clamp ring proximate to the wafer. The yoke surface includes a concave circumferential portion that is curved to provide a reflector, for example a parabolic or elliptical reflector, that is positioned having a focal point coincident with the wafer edge. Reflector positioning and spacing relative to the wafer surface encourage reflection of heat radiated from the edge portion of the wafer surface back to the wafer edge to mitigate thermal losses at the wafer edge and improve temperature uniformity across the surface of the wafer.

11 Claims, 5 Drawing Sheets

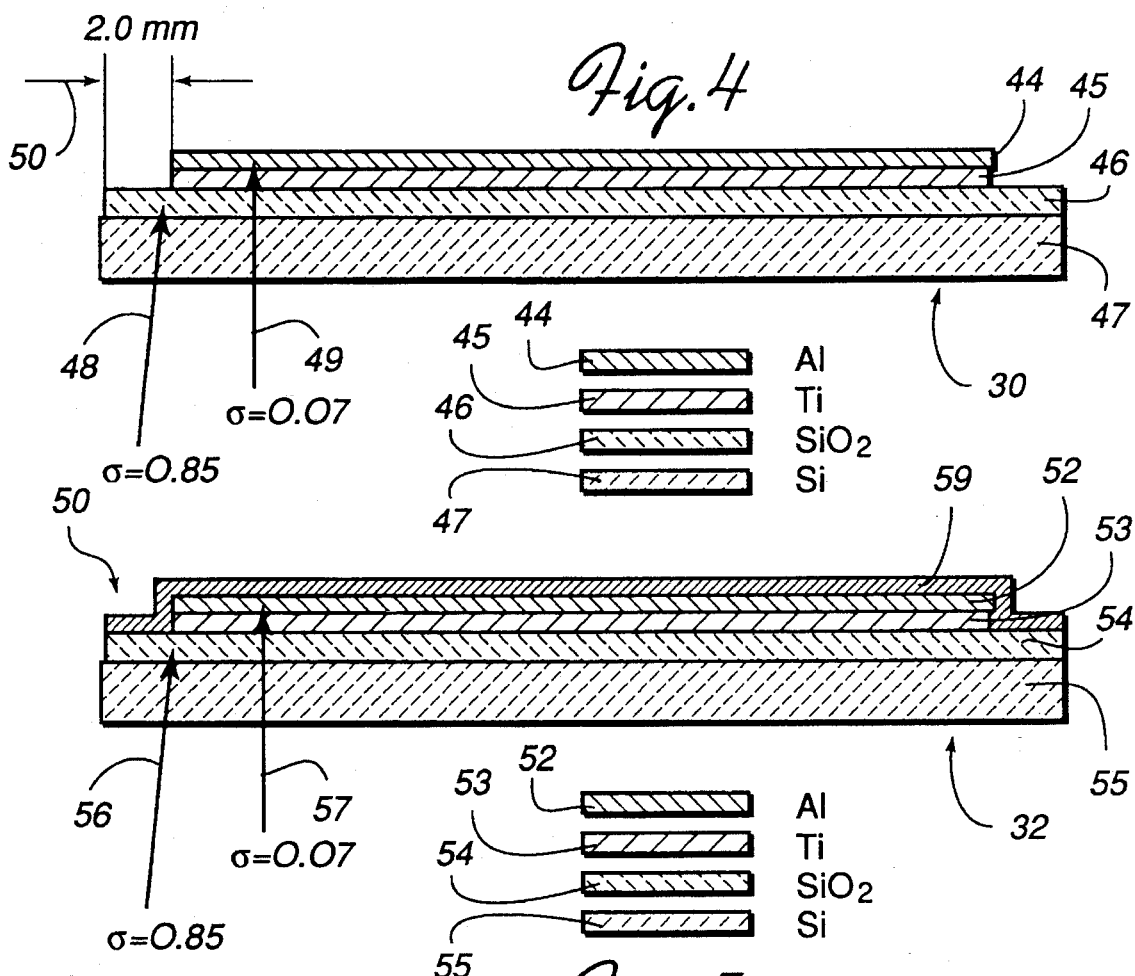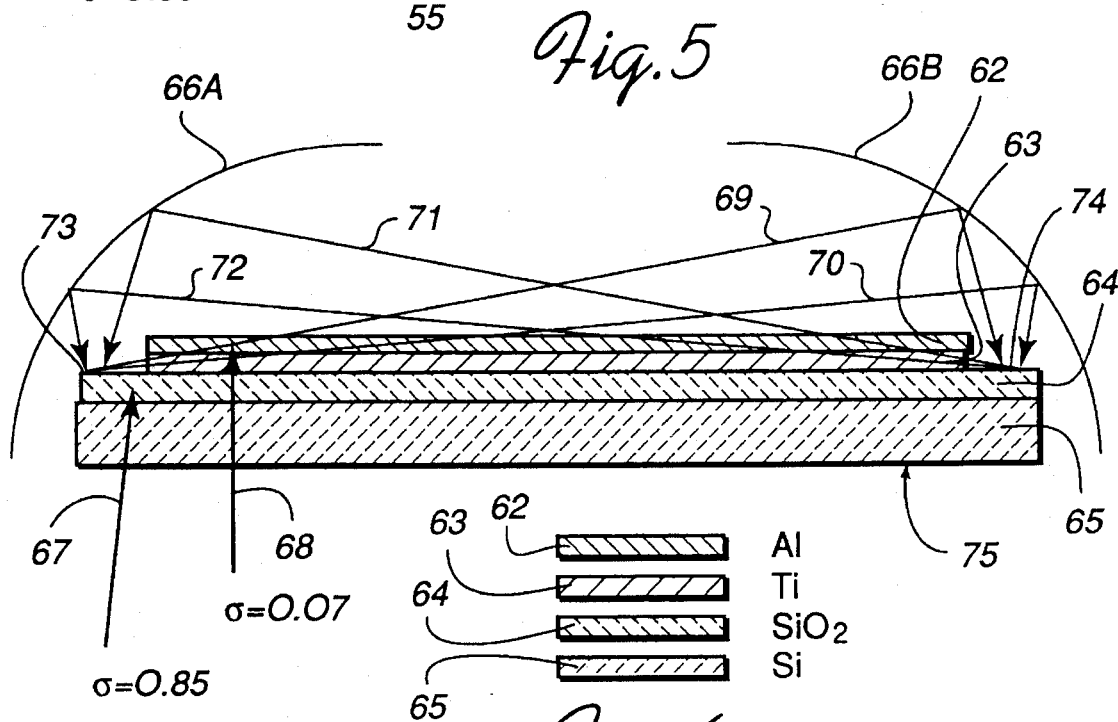

METHOD AND APPARATUS FOR IMPROVING SEMICONDUCTOR WAFER SURFACE TEMPERATURE UNIFORMITY

BACKGROUND OF THE INVENTION

1. Technical Field

The invention herein described relates to the processing of semiconductor wafers, for example during the fabrication of integrated circuits. More particularly, the invention relates to improving temperature uniformity across the wafer surface when processing semiconductor wafers.

2. Description of the Prior Art

A critical factor in assuring the high level of process reproducibility that is necessary for the efficient manufacture of semiconductor devices is the consistency or uniformity of processing conditions, such as temperature, pressure, etc. Process deviations, such as temperature gradients across a semiconductor wafer surface, especially in temperature sensitive processes, can seriously degrade process yields and therefore degrade the efficiency of the manufacturing process.

In the following discussion, the effect of lack of temperature uniformity across a wafer surface is examined in connection with a hot aluminum planarization process for purposes of example. This process is particularly useful where submicron device features are desired.

In submicron processes it is difficult to obtain sufficient step coverage for contact holes during device fabrication using conventional sputtering technology. In such processes, it is preferable to use hot aluminum planarization when forming both the contact plugs and the interconnection. This promising technology provides the advantages of avoiding the high complexity, high cost, high contact resistivity and poor controllability of the contact resistance, and the generation of contaminating particles associated a Tungsten CVD plug process. See, for example M. Taguchi, K. Koyama, Y. Sugano, Quarter Micron Hole filling With SiN Side Walls By Aluminum High Temperature Sputtering, IEEE VMIC Conference, pg. 219 (1992); H. H. Hoang, F. S. Chen, M. Zamanian, G.A. Dixit, C. C. Wei, F. T. Lious, Reliability Study of Planarized Aluminum Metallization, IEEE VMIC Conference, pg. 411 (1991); C. S. Park, S. I. Lee, J. H. Park, J. H. Sohn, D. Chin, J. G. Lee, AI-PLAPH Process For Planarized Double Metal CMOS Application, IEEE VMIC Conference, pg. 326 (1991); H. Nishimura, T. Yamada, S. Ogawa, Reliable Submicron Vias Using Aluminum Alloy High Temperature Sputter Filling, IEEE VMIC Conference, pg. 170 (1991); and H. Ono, Y. Ushiku, T. Yoda, Development of a Planarized AI-Si Contact Filling Technology, IEEE VMIC Conference, pg. 76 (1991).

In general, the hot aluminum planarization process can be classified as one of a high temperature reflow process, a cold/hot deposition process, or a coherent cold/hot deposition process. For example, in the high temperature reflow process, the wafer is heated to a temperature that is higher than about two-thirds of the melting point of aluminum (350° C.), such that solid phase diffusion becomes dominant. The chemical potential difference induced by surface morphology drives the aluminum into the contact holes.

Various techniques are known for heating a wafer during processing. See, for example Muka, Heater Assembly For Thermal Processing of a Semiconductor Wafer in a Vacuum Chamber, U.S. Pat. No. 4,481,406, 6 Nov. 1984 (heater assembly including shields to reflect heat to a workpiece and thereby reduce process energy requirements); R. Anderson, T. Deacon, D. Carlson, Apparatus and Method For Substrate Heating Utilizing Various Infrared Means To Achieve Uniform Intensity, U.S. Pat. No. 5,179,677, 12 Jan. 1993 (reflector array within a remote heat source for balancing thermal radiation intensity across a heated surface); J. Wortman, F. Sorrell, J. Hauser, M. Fordham, Conical Rapid Thermal Processing Apparatus, U.S. Pat. No. 5,253,324, 12 Oct. 1993 (conical reflector for heating array); and K. Yamabe, K. Okumura, Method of Thermally Processing Semiconductor Wafers and an Apparatus Therefor, U.S. Pat. No. 5,259,883, 9 Nov. 1993 (thermal processing tube including a first, high temperature portion having a heat source, and a second, low temperature portion having a heat reflector).

Hot aluminum planarization technology has advantages over other techniques in terms of process simplicity and low resistivity, as well as the capability to fill-in contact holes with aspect ratio high than three. However, the process is sensitive to temperature non-uniformity across the surface of semiconductor wafers during flow processing of aluminum. Such temperature non-uniformity results in poor planarization of the aluminum film. A lack of temperature uniformity across the wafer surface also causes voiding of contact holes in a region that is about 20 mm from the edge of the wafer. The magnitude of this problem becomes apparent when one considers that modern semiconductor devices contain millions of transistors and, therefore, a typical wafer may contain more than a billion contacts. Failure to complete one contact can ruin a device.

This problem is especially pronounced when the processing temperature is higher than 500° C. For example, for hot aluminum planarization, typical process parameters dictate that temperature variation across the wafer surface must be less than ±5° C. at 600° C.

Such temperature non-uniformity across the wafer surface is thought to be caused by heat loss or by a heating gas leak at the wafer edge. The heat loss mechanism is a radiative loss, since heat convection and conduction are negligible in a ultra-high vacuum ("UHV") system, such as a flow chamber, as is typically used for hot aluminum planarization and other processes.

Although it is known to heat a wafer during processing by applying heat in a uniform manner, it is not known how to assure temperature uniformity across a wafer surface, especially at the wafer edges. Lack of temperature uniformity across the wafer surface reduces device yield per wafer and thus makes the production of semiconductor devices significantly more expensive. A technique that provides improved temperature uniformity across the wafer surface would benefit the semiconductor industry, especially with regard to the new and emerging processing techniques, such as hot aluminum planarization, that are being developed to manufacture devices having submicron feature sizes.

SUMMARY OF THE INVENTION

The invention improves temperature uniformity across the surface of a semiconductor wafer, for example during wafer processing at high temperatures, by reflecting heat that is radiated from the surface of the wafer back to the wafer.

A processing chamber of the type with which the invention is intended to be used includes a wafer pedestal adapted to heat and cool a wafer during processing. The wafer is secured to the pedestal with a wafer clamp ring. A yoke is positioned atop the clamp ring. The yoke includes a first yoke surface that is positioned proximate to the wafer in spaced facing relation with the wafer surface. The yoke surface includes a concave circumferential portion that is arranged to have a focal point that is coincident with or close to the wafer edge. The concave portion of the yoke is curved to provide a reflector. The curvature of the reflector surface is chosen in view of the application to which the invention is put. For some applications, a parabolic reflector is provided; while in other applications, an elliptical reflector is provided. Reflector positioning and spacing relative to the wafer surface encourage reflection of heat radiated from the edge portion of the wafer surface back to the wafer edge to mitigate thermal losses at the wafer edge, and improve temperature uniformity across the surface of the wafer.

BRIEF DESCRIPTION OF THE DRAWINGS

FIG. 4 is a cross sectional side elevation view of a typical semiconductor wafer;

FIG. 5 is a cross sectional side elevation view of a semiconductor wafer that has been coated with a 0.1 μm (1 kÅ) 101 Ti film;

FIG. 6 is a cross sectional side elevation view of an elliptical reflector and a typical semiconductor wafer during wafer processing according to the invention;

DETAILED DESCRIPTION OF THE INVENTION

Figure 1:
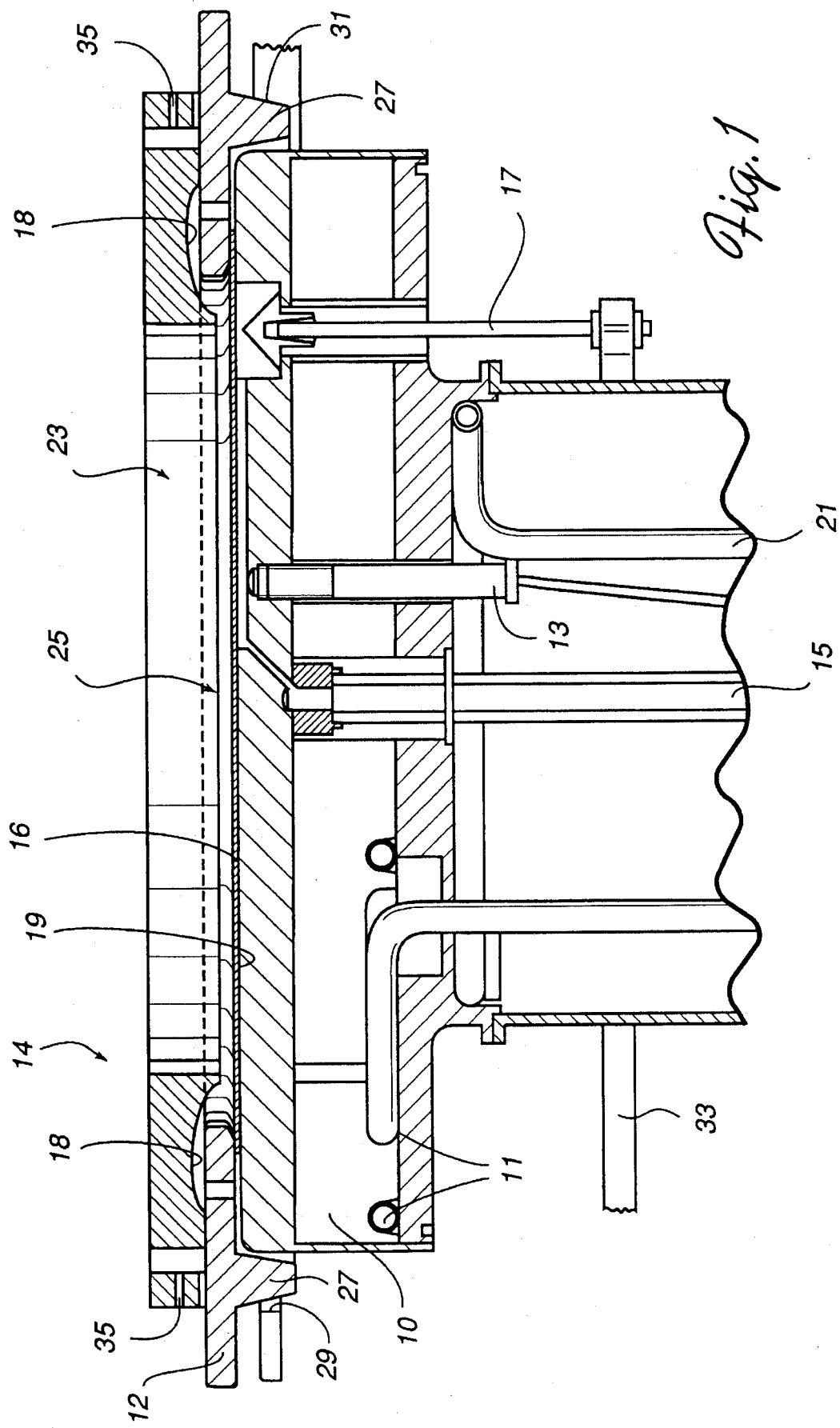
FIG. 1 is a cross sectional side elevation view of a wafer chuck and clamping assembly including a yoke having a surface in the form of a parabolic reflector according to the invention.

The invention provides a method and apparatus for improving temperature uniformity across the surface of a semiconductor wafer during wafer processing. FIG. 1 is a cross sectional side elevation view of a wafer chuck 10 and clamping assembly 12, including yoke 14 having a surface that includes a concave portion 18, that is curved to provide a parabolic reflector. The chuck shown for purposes of example in the figure includes a flat upper surface 19 that is adapted to support a semiconductor wafer 16 during wafer processing. Such processing may involve such known techniques as ion implantation, CVD, PVD, reactive ion etching, etc. Although the examples provided herein are directed to processes involving annealing and reflow and not deposition, the invention may be used for many other processes.

The clamping assembly 12 secures the wafer 16 to the wafer chuck surface 19 during wafer processing. Typical wafer clamping assemblies are formed as ring-shaped members having an open inner portion 25 that allows access to the wafer surface during the various processing steps. The clamping assembly also includes a locating flange 27 that is configured to rest in a complementary slot 29, 31 during wafer clamping. A lift assembly, including a lift bracket 33 and lift finger(s) 17, is provided to raise and lower the wafer relative to the wafer chuck surface 19 and thereby allow the wafer 16 to be placed on and removed from the wafer chuck 10.

An important function of the wafer chuck is to provide thermal mass that precisely maintains the wafer at a desired temperature. Heating elements 11 are provided to raise the wafer temperature. For example, the heating elements may be provided as a dual-zone heater, i.e. a heater having two heating zones, or as a five-zone heater, i.e. a heater having five heating zones.

A thermal transfer gas may be supplied to a backside of the wafer through a gas conduit 15 to heat the wafer, and a cooling fluid, such as water, can be supplied to the wafer chuck through a fluid conduit 21. A thermocouple 13 that monitors the temperature of the wafer chuck surface 19 is used to control the temperature of the wafer by controlling the amount of heat and/or cooling supplied to the wafer by the heating elements 11, thermal transfer gas conduit 15, and/or cooling fluid conduit 21. The heating elements may be arranged in any of several known configurations.

Many processes require that the wafer be maintained at an elevated temperature over an extended period of time, for example for sintering, reflow, planarization, and other process steps. The invention provides a yoke 14 having a ring-like configuration. The yoke is placed atop the clamping assembly 12 proximate to the wafer 16 such that the yoke has a surface that has a spaced facing relation with the surface of the wafer. The yoke is held in place relative to the clamping assembly via frictional engagement, gravitational force, complementary engagement of mating parts, etc.

The yoke includes a concave portion 18 formed in the yoke surface that faces the wafer, and that extends about the circumference of the yoke. The yoke may have an open inner portion 23 that allows access to the wafer surface during wafer processing. The yoke may also have a vent hole 35 that allows for outgassing during heating.

The concave portion 18 has a curvature, for example a parabolic surface or an elliptical surface, and therefore acts as a reflector. Reflector positioning and spacing relative to the wafer surface encourage reflection of heat radiated from the edge portion of the wafer surface and wafer chuck back to the wafer edge to mitigate thermal losses at the wafer edge, and improve temperature uniformity across the surface of the wafer. A reflector surface having a parabolic surface is chosen for applications where heat radiated from the edge of the wafer chuck is to be reflected to the wafer edge; while a reflector surface having an elliptical surface is chosen for applications where heat radiated from the edge of the wafer is reflected to the opposite wafer edge.

In operation the clamping assembly 12 and yoke 14 are first raised from the wafer chuck 10 by a lifter (not shown). The wafer 16 to be processed is then slid into position above the wafer chuck by a robot arm (not shown) and placed on several lift fingers 17. The lift fingers are retracted, thereby lowering the wafer onto the wafer chuck surface 19. The clamp ring and yoke are then lowered into position and wafer processing may begin.

Figure 2:
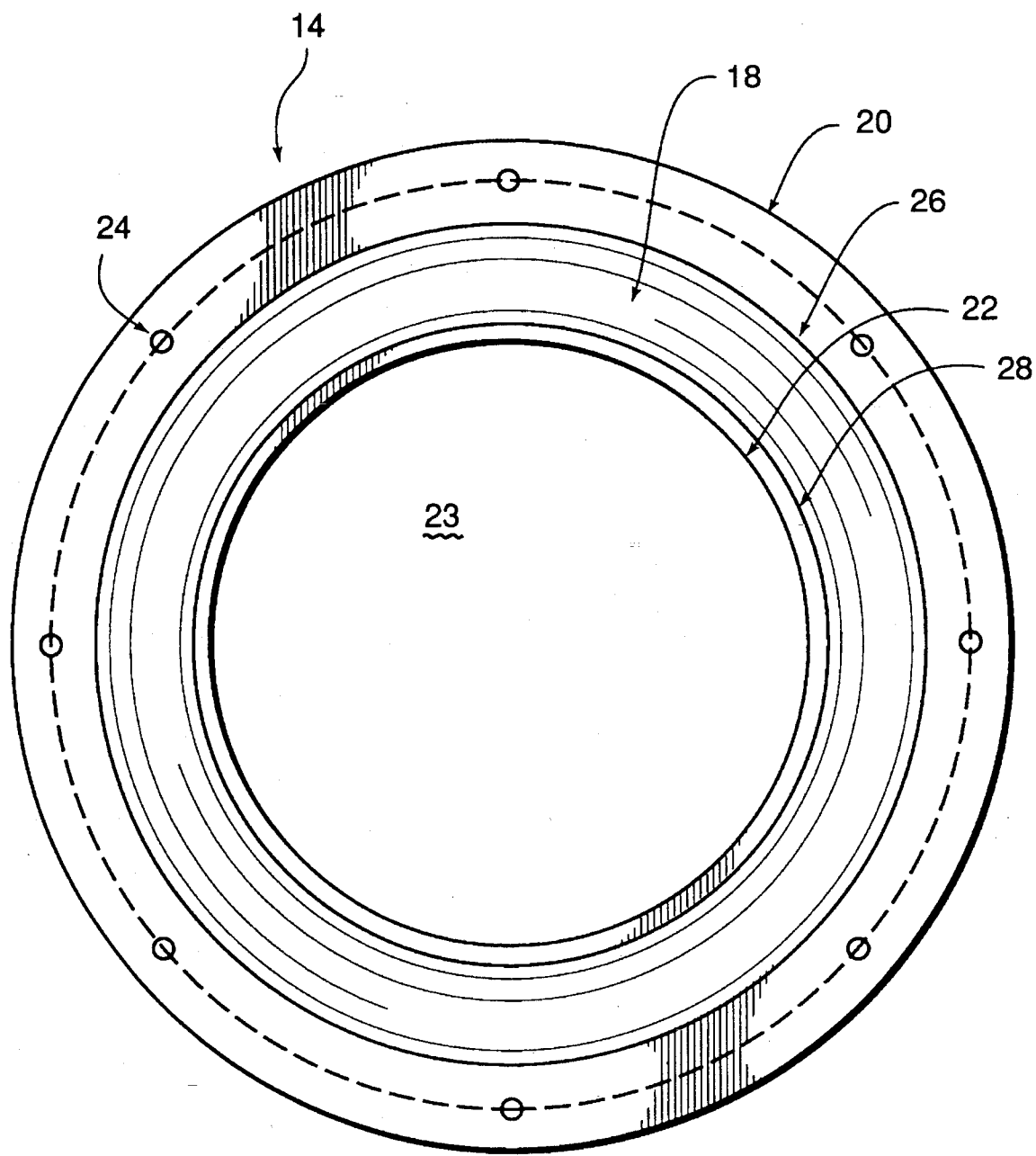
FIG. 2 is a bottom plan view of the yoke according to the invention.

FIG. 2 is a bottom plan view of the yoke of FIG. 1 according to the invention. The exemplary yoke 14 is intended for use with 200 mm (8-inch) wafers, although the yoke is readily adapted for use with wafers of any size. The exemplary yoke therefore has an inner diameter, as indicated by numeric designator 22, of about 16.25 cm (6.4 inches); an outer diameter (numeric designator 20) of about 25.9 cm (10.2 inches); and a concave portion 18 defining a reflector that extends about the circumference of the yoke and that has a width, as indicated by numeric designators 26 and 28, of about 5.08 cm (2 inches). Several holes 24 are formed in the yoke to allow the yoke to be positioned on and secured to the clamping assembly.

The yoke is formed from any process compatible material that is both thermally and optically stable and that is able to withstand the various temperature and chemical conditions found within the processing environment. For example, aluminum, ceramic materials, etc. may be used to form the yoke. The reflector surface must be formed of an optically stable, preferably non-oxidizing material that exhibits high infrared reflectivity. Typically, materials that are good electrical conductors, such as nickel, gold, copper, silver, etc. exhibit such reflectivity.

In the preferred embodiment of the invention, the reflector surface is made of nickel. A yoke is first formed of a base material by casting, forging, etc. The yoke is then placed into a solution containing nickel and nickel is deposited on the reflector surface of the yoke by an electroforming or electrolysis process. After a layer of nickel is formed on the reflector surface of the yoke, the yoke is removed from the electroforming solution and the reflector surface is optically polished. It should be appreciated that many methods of forming or coating a reflective surface are known and that the invention is not limited to the technique described above.

Figure 3:
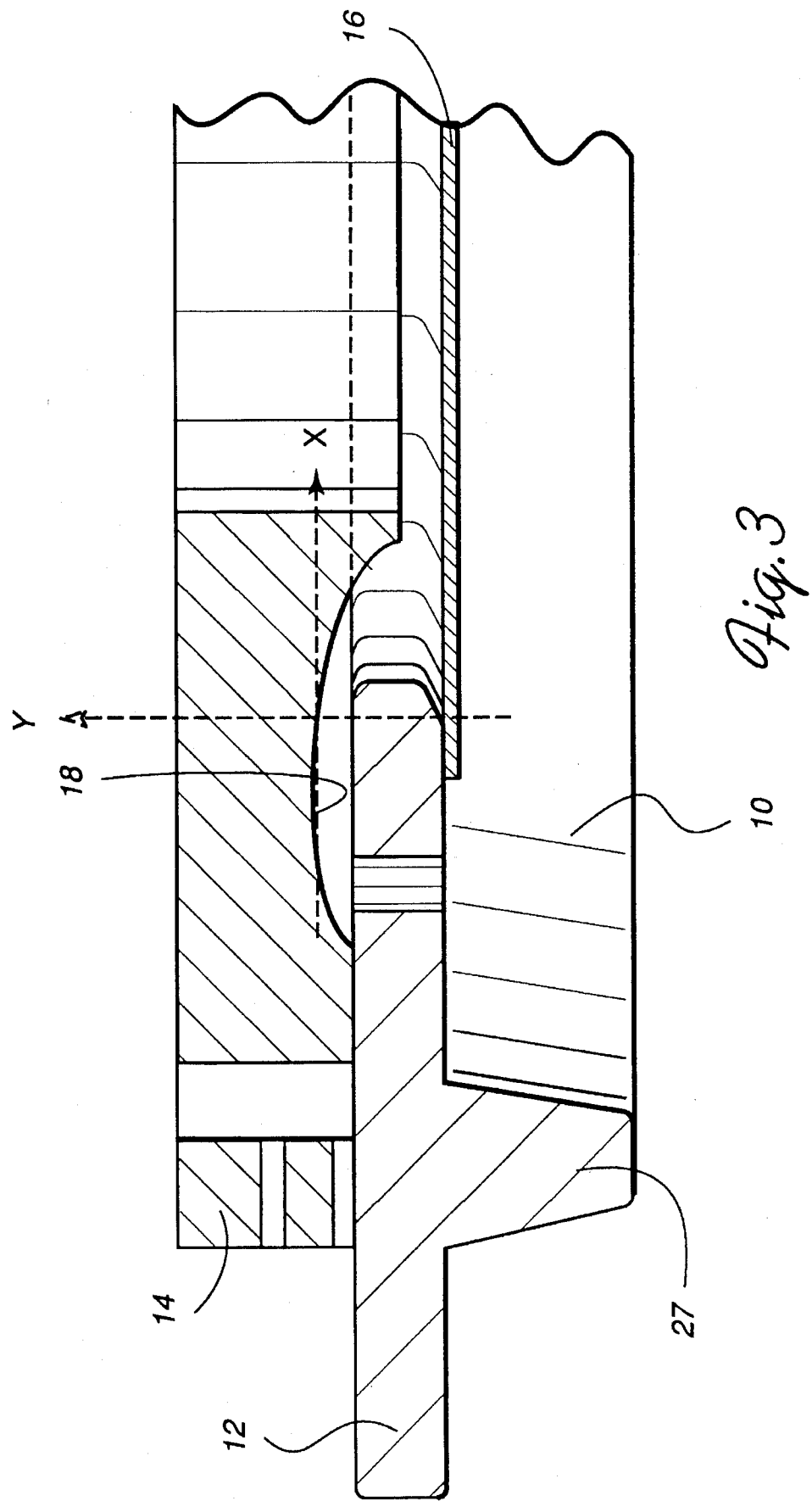
FIG. 3 is a partial detailed cross sectional side elevation view of the yoke of FIGS. 1 and 2 according the invention.

FIG. 3 is a partial detailed cross sectional side elevation view of the yoke of FIGS. 1 and 2. In the figure two axes, Y and X, are shown relative to the curvature of the reflector surface of the yoke. The reflector is defined as a desired function, e.g. parabolic, elliptical, hyperbolic, etc., based upon the reflective qualities required for the application to which the yoke is put. The reflector surface in the exemplary embodiment of the invention has a slope defined according to a parabolic function $Y=nX^2$, where n is defined as the focal length of curvature. In the exemplary embodiment of the invention, $Y=-0.698 X^2$.

The yoke is configured such that an innermost portion of the reflector surface overhangs, and extends below an upper surface of, the clamping assembly and thereby provides maximum reflection of heat to the wafer surface. In the exemplary embodiment of the invention, the reflector surface extends below the upper surface of the clamping assembly by about 3.6 mm (0.14 inches) and has a focal point that is about 9.1 mm (0.36 inches) from the reflector surface.

The factors that cause temperature non-uniformity in a flow chamber include heater temperature uniformity, clamp ring effect, radiative heat loss, heating gas effect, etc. The heat loss mechanism in a 200 mm (8 inch) flow chamber, accounting for heat loss at wafer edge, is thought to be primarily due to the difference in emissivity between Al and $SiO_2$. This mechanism was confirmed experimentally by coating the entire surface of a wafer (i.e. 101%) with Titanium ("101 Ti"). The heat loss at the heater edge and at the wafer edge were both found to contribute to the temperature non-uniformity on the wafer. The heat loss at heater edge is compensated for by employing a larger heater, e.g., 228.6 mm (9 inch) heater. For example, the total heat loss could be compensated for by using a 5-zone heater in combination with an aluminum foil reflector. By combining the 5-zone heater with a reflector, the temperature non-uniformity across the surface of the wafer was reduced to ±4° C.

EXAMPLE 1

FIG. 4 is a cross sectional side elevation view of a typical semiconductor wafer 30 including a silicon substrate 47, a $SiO_2$ layer 46, a Ti layer 45, and an Al layer 44. During wafer processing, Ti/Al metal stacks were deposited on a 1 μm (10 kÅ) $SiO_2$ wafer for temperature measurement. The process sequence consists of 350° C. de-gas/0.2 μ(2 kÅ)Ti/ 0.6 μm(6 kÅ)Al-0.5% Cu. The heater temperature was set to 50° C., and low power sputtering (2 kW) was used for Al film deposition to avoid the plasma heating effect. The uniformity for both Ti and Al were 1.2% 1s. The Ti/Al film was premeasured and the sheet resistance ("Rs") map after heat treatment was subtracted by the premeasured map to obtain Rs shift.

The experiment was conducted in a prototype flow chamber for a 200 mm (8-inch) wafer. Both dual-zone heater and 5-zone heaters were tested to understand the effect of the heater temperature non-uniformity on wafer temperature non-uniformity.

The emissivity of aluminum film is very different from that of $SiO_2$. That is, the emissivity for Al is 0.07 (as indicated by numeric designator 49); and for $SiO_2$ is 0.85 (as indicated by numeric designator 48). For standard aluminum processes, the edge exclusion is 2 mm, i.e. a 2 mm portion 50 of the wafer at the wafer edge is not covered by Al film, as shown in FIGS. 4 and 5.

EXAMPLE 2

The high emissivity of $SiO_2$ enhances the heat loss at wafer edge. To test this effect, the entire wafer was coated with a 0.1 μm (1 kÅ) 101 Ti film after Ti/Al deposition to even the emissivity as shown in FIG. 5, which is a cross sectional side elevation view of a semiconductor wafer 32, including a silicon substrate 55, a $SiO_2$ layer 54, a first Ti layer 53, and an Al layer 52, and that has been coated with a 0.1 μm (1 kÅ) 101 Ti film 59. Before the 101 Ti deposition, the wafer was left at atmosphere for a week to form a good aluminum oxide layer, so that the interdiffusion between 101 Ti and Al becomes negligible. The emissivity for Al is 0.07 (as indicated by numeric designator 57); and for $SiO_2$ is 0.85 (as indicated by numeric designator 56).

EXAMPLE 3

The effect of the reflective mirror was investigated using an aluminum foil reflector as shown in FIG. 6, which is a cross sectional side elevation view of an elliptical reflector and a typical semiconductor wafer during wafer processing. The wafer includes a silicon substrate 65, a $SiO_2$ layer 64, a Ti layer 63, and an Al layer 62. Emissivity for Al is 0.07 (as indicated by numeric designator 68); and for $SiO_2$ is 0.85 (as indicated by numeric designator 67).

In the figure, a wafer 74 is shown having an elliptical reflector 66a/66b positioned thereabove. The paths of thermal reflection, as indicated by the arrows at the end of each of the lines identified by numeric designators 69, 70, 71, 72, show that heat from the edges 73, 74 of the wafer and wafer chuck is reflected back to the wafer surface to the opposite side of the wafer.

Figure 7:
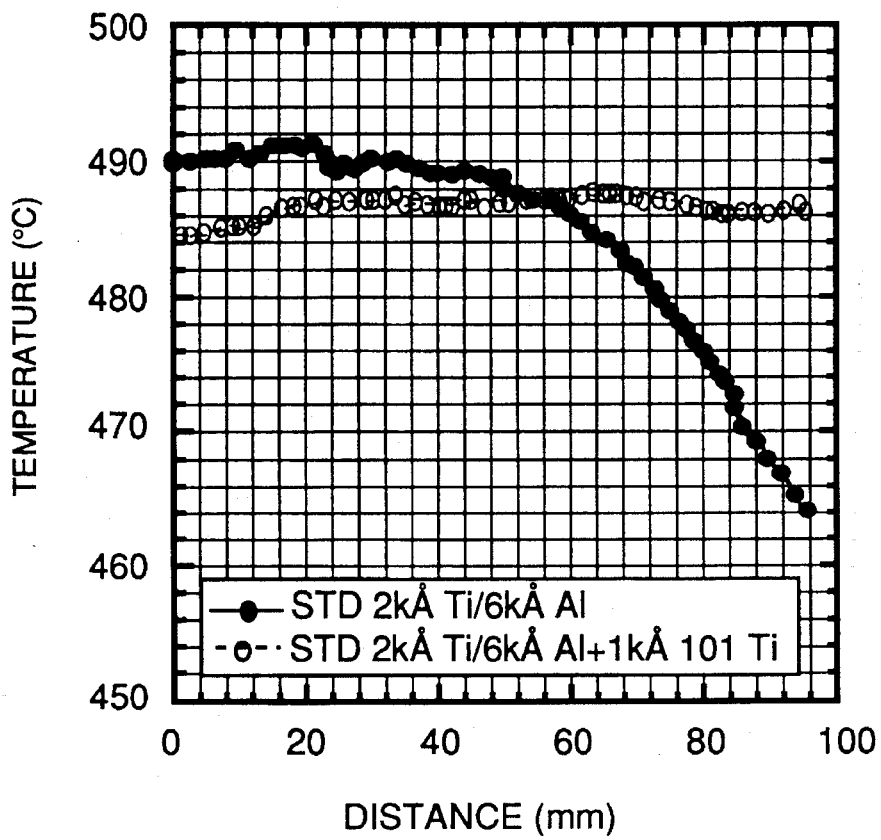
FIG. 7 is a graph showing a temperature profile of the wafers of FIGS. 4 and 5 when heated on a pedestal.

The temperature profile of the wafers heated by a 5-zone heater is shown in FIG. FIG. 7, which is a graph showing a temperature profile of the wafers of FIGS. 4 and 5 where the wafers are heated on a pedestal. The wafer that was coated with standard Ti/Al showed a large temperature drop at wafer edge as indicated by black circles, although high heating power was applied to edge zone of the heater. On the other hand, the wafer with Ti/Al/101 Ti stack showed the temperature difference less than 4° C. This result is thought to occur because the emissivity across the wafer becomes equal after 101 Ti deposition. However, a typical VLSI process uses a Ti/Al layer structure and not a Ti/AlFFi layer structure. Accordingly, while the values obtained for the Ti/AlFFi layer structure are of experimental interest, the Ti/Al/Ti layer structure does not provide a practical solution to the problem of lack of thermal uniformity across the wafer surface.

The graph of FIG. 7 indicates that the emissivity difference between Al and $SiO_2$ is one of the major causes of heat loss at the wafer edge. This is also good evidence that backside gas leakage at wafer edge and the clamp ring effect are not of importance. It is the aluminum reflective mirror that reduces the heat loss at the wafer edge.

EXAMPLE 5

Figure 8:
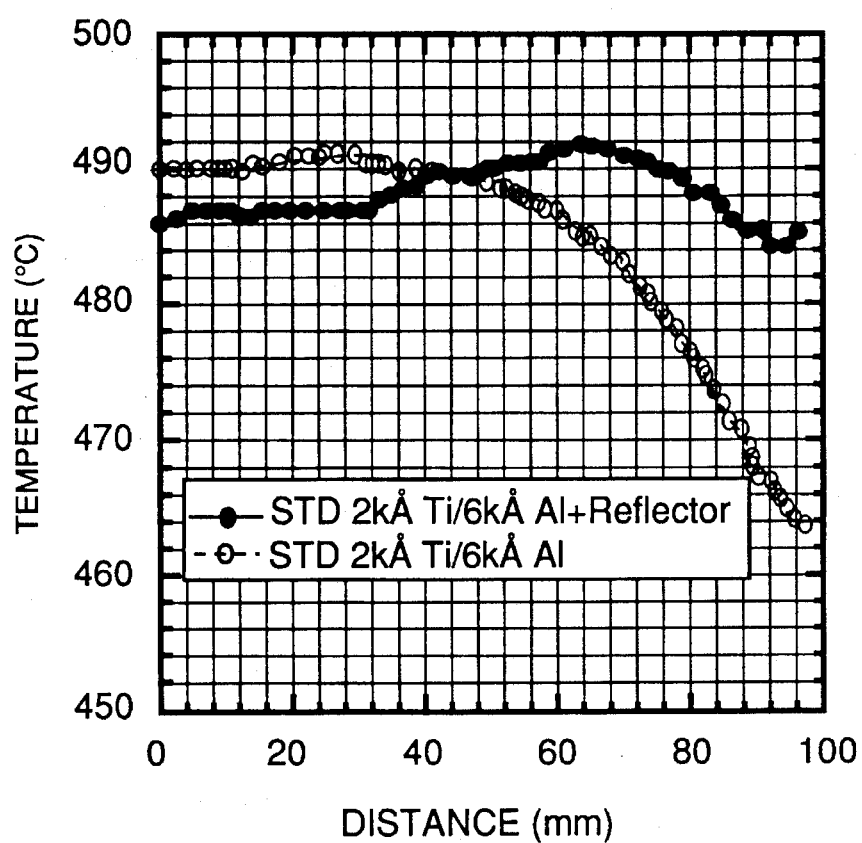
FIG. 8 is a graph showing a temperature profile of the wafer of FIG. 4 when heated on a pedestal in a processing environment that includes an elliptical edge reflector according to the invention.

FIG. 8, which is a graph showing a temperature profile of the wafer of FIG. 4 when heated on a pedestal in a processing environment that includes an elliptical edge reflector, shows the wafer temperature profile when an aluminum reflector was added. It is clear that the reflector reduced the temperature difference on the wafer down to about 8° C. To improve the temperature uniformity further, i.e. continuous improvement, a parabolic shape mirror made of nickel was designed which has reflectivity up to 95% for IR.

Although the invention is described herein with reference to the preferred embodiment, one skilled in the art will readily appreciate that other applications may be substituted for those set forth herein without departing from the spirit and scope of the present invention. For example, various reflector slopes may be used, depending upon the application to which the invention is put. Accordingly, the invention should only be limited by the claims included below.

I claim:

1. An apparatus for improving thermal uniformity across a semiconductor wafer surface during wafer heating, comprising:

an annular yoke having a yoke surface positioned proximate to said wafer in spaced facing relation thereto; said yoke surface defining a concave circumferential reflector; said reflector positioned proximate to and coincident with said wafer surface, wherein said reflector is positioned relative to a wafer edge to reflect thermal energy radiated from said wafer edge back thereto, and wherein said yoke is placed atop a ring-like wafer clamping assembly, such that an innermost portion of the reflector surface overhangs, and extends below an upper surface of, said clamping assembly and thereby provides maximum reflection of heat to said wafer surface.

2. The apparatus of claim 1, wherein said reflector is an infrared mirror.

3. The apparatus of claim 2, wherein said infrared mirror is formed of an optically stable, highly reflective, non-oxidizing material.

4. The apparatus of claim 3, wherein said infrared mirror is formed of nickel.

5. The apparatus of claim 1, wherein said reflector is sloped to project downward below a clamping assembly upper surface.

6. The apparatus of claim 1, wherein said reflector is a parabolic reflector having a focal point at said wafer edge.

7. The apparatus of claim 1, wherein said reflector is an elliptical reflector having a focal point at said wafer edge.

8. A method for improving thermal uniformity across a semiconductor wafer surface during wafer heating, comprising the steps of:

positioning an annular yoke having a yoke surface proximate to said wafer in spaced facing relation thereto; said yoke defining a concave circumferential reflector; said reflector positioned proximate to and coincident with said wafer surface;

wherein said yoke is placed atop a ring-like wafer clamping assembly having an open inner portion, and wherein said yoke is configured such that an innermost portion of a reflector surface overhangs, and extends below an upper surface of, said clamping assembly and thereby provides maximum reflection of heat to said wafer surface;

positioning said reflector relative to a wafer edge to reflect thermal energy radiated from said wafer edge back thereto; and reflecting thermal energy radiated from said wafer surface back thereto with said reflector.

9. The method of claim 8, wherein said reflector is sloped to project downward below a clamping assembly upper surface.

10. The method of claim 8, wherein said reflector is a parabolic reflector.

11. The method of claim 8, wherein said reflector is an elliptical reflector.

* * * * *